(12) United States Patent
Domitrovits et al.

(10) Patent No.: US 7,791,892 B2
(45) Date of Patent: Sep. 7, 2010

(54) ELECTRONIC COMPONENT FOR AN ELECTRONIC CARRIER SUBSTRATE

(75) Inventors: Michael J. Domitrovits, New Paltz, NY (US); Edward J. Donnelly, Highland, NY (US); Raymond F. Frizzell, Jr., Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 639 days.

(21) Appl. No.: 11/669,362

(22) Filed: Jan. 31, 2007

(65) Prior Publication Data

US 2008/0180900 A1 Jul. 31, 2008

(51) Int. Cl.
*H05K 1/14* (2006.01)
(52) U.S. Cl. .................................. 361/737; 361/728
(58) Field of Classification Search .......... 361/684, 361/761, 737; 29/840; 439/33, 83, 590, 439/634, 637, 639
See application file for complete search history.

(56) References Cited

U.S. PATENT DOCUMENTS

| | | | |
|---|---|---|---|
| 4,722,691 A | 2/1988 | Gladd et al. | |
| 4,802,860 A | 2/1989 | Kikuta | |
| 5,350,307 A | 9/1994 | Takagishi et al. | |
| 5,628,638 A | 5/1997 | Tojo et al. | |
| 6,064,576 A | 5/2000 | Edwards et al. | |
| 6,181,562 B1 | 1/2001 | Berg et al. | |
| 6,492,071 B1 | 12/2002 | Bernier et al. | |
| 6,530,412 B1 | 3/2003 | Cronin et al. | |
| 6,740,820 B2 | 5/2004 | Cheng | |
| 6,764,325 B2 | 7/2004 | Arrigotti et al. | |
| 6,919,515 B2 | 7/2005 | Blackshear et al. | |
| 7,258,551 B2 * | 8/2007 | Minich | 439/67 |
| 7,472,477 B2 * | 1/2009 | Beaman et al. | 29/840 |
| 2005/0168957 A1 | 4/2005 | Kawauchi et al. | |
| 2007/0236901 A1 * | 10/2007 | Grundy et al. | 361/785 |

OTHER PUBLICATIONS

IBM TDB n10A Mar. 1992; Bryce, et al., "Applied Card Edge Connector"; 1992.

* cited by examiner

*Primary Examiner*—Jeremy C Norris
*Assistant Examiner*—Yuriy Semenenko
(74) *Attorney, Agent, or Firm*—Scully, Scott, Murphy & Presser, P.C.; Steven L. Bennett, Esq.

(57) ABSTRACT

Disclosed are an electronic component, an assembly of an electronic component and an electronic carrier substrate, and a method of connecting the electronic component to the carrier substrate. The carrier substrate has a first coefficient of thermal expansion (CTE), and the electronic component has a second CTE. The assembly further comprises a conductive material on the carrier substrate for connecting the electronic component to the carrier substrate, and the electrical component is connected to the carrier substrate by heating and then cooling this conductive material. The electronic component includes an expansion joint to allow the electronic component to expand and contract relative to the carrier substrate during the heating and cooling of the conductive material.

11 Claims, 1 Drawing Sheet

ELECTRONIC COMPONENT FOR AN ELECTRONIC CARRIER SUBSTRATE

BACKGROUND OF THE INVENTION

1. Field of the Invention

This invention generally relates to electronic components that are secured to electronic carrier substrates. More specifically, the invention relates to providing such components with expansion joints to reduce the effect of thermal differential between the component and the carrier substrate, which for example may be a printed circuit board.

2. Background Art

Decreasing packaged circuit board size, decreasing packaging costs, and increasing component-packaging density are ongoing goals of the computer industry, and specifically the substrate packaging industry. Accordingly, various components are typically connected to the carrier substrate, for example printed circuit boards, through an electronic connection made by a conductive material, such as solder. Some components connect directly to the carrier substrate, such as capacitors, resistors, CPUs and the like. Other components detachably connect to the carrier substrate through various connectors, which are connected to the carrier substrate. Connectors come in a variety of sizes and mount to carrier substrates to enable various memory modules and input output devices to electrically connect to the carrier substrate. Example connectors include Dual In-line Memory Module Sockets ("DIMM Sockets") and card edge connectors for secondary boards.

The effectiveness of the components that connect to the carrier substrate depends largely on the integrity of the electrical connection between the carrier substrate and the particular connector or component. Two primary techniques to attach components to carrier substrates are Through Hole Mount technology ("THM"), and surface mount technology ("SMT").

THM has been a common way of attaching components, especially connectors, to carrier substrates for over forty years. In THM components, the component leads consist of individual pins that engage a corresponding electrical interface pattern, which are holes in the carrier substrate that form a hole pattern. THM technology, however, limits the density that components can be placed on a carrier substrate because the holes penetrate all layers of the carrier substrate, which in turn restricts or blocks routing channels on every layer.

SMT is a newer technology. SMT differs from THM in that the electrical interface pattern on the carrier substrate are not holes, but rather consists of pads that reside on the surface of the carrier substrate. The component, then, sits on top of the carrier substrate with its component leads in contact with or in close proximity to the carrier substrate electrical interface pattern. This maximizes the available routing space on the carrier substrate and allows denser packing of components.

Currently, both THM and SMT components are typically fixed to the board through a soldering process. THM components typically go through a wave soldering process, which is well known to those skilled in the art. Briefly, in a wave soldering process, THM components are placed on the carrier substrate, the carrier substrate enters the wave solder machine, encounters a preheat region, and is passed over the top of a molten solder wave. When the solder wave contacts the portion of the component leads protruding through the electrical interface pattern holes, the solder is drawn up into the hole and the component lead via capillary action. As the board moves beyond the solder wave, the temperature is reduced and the solder solidifies, securing the connection between the component lead and the electrical interface pattern hole in the carrier substrate.

SMT components are typically connected to the carrier substrate through a solder reflow process. The solder reflow process is also well known in the art of carrier substrate packaging. A conductive material is placed on the carrier substrate at designated spots to which the leads of the component are to attach. The component is placed onto the carrier substrate with conductive material (e.g. solder) residing between the component leads and the electrical interface pattern of the carrier substrate. The carrier substrate then passes through a reflow oven where it encounters a profile of gradually rising temperature, reaching a peak temperature above the solder reflow temperature where the conductive material melts and makes the electrical connection. The process is concluded with a cool down period where the conductive material solidifies. The solder reflow process is more desirable than the wave solder process in that it is generally more efficient, environmentally friendly, and cost effective.

A problem exists, however, with both the wave solder process and the solder reflow process. Varying Coefficients of Thermal Expansion (CTE) between connectors and Printed Circuit boards (PCB's) create high stresses and unmanufacturable solder interfaces on long Surface Mount Technology (SMT) parts. Current solutions include trying to match connector CTE with PCB CTE. The costs of doing this are high and not possible in many cases. During the solder reflow process, both the PCB and connector are heated in a convection reflow of vapor phase oven. As the PCB cools, the solder solidifies and then the PCB and connector continue to cool down at different rates. CTE mismatches between the board and connector create stresses in the solder joints and bow both the connector and board which could lead to reliability problems and low manufacturing yields. This mismatch of CTE will cause bowing of the connector, possibly lifting the connector contacts which in turn will result in missing or insufficient solder. If the connector remains bowed, plugging problems may occur on the separable interface, yet another reliability concern. The amount of bowing will depend on connector length (CTE differential), board thickness, reflow profiles, and Tg (glass transition temperature) of the board.

Also, when a lot of the connectors are placed on a PCB, the board itself can bow as the solder solidifies and the glass transition temperature is below the solder solidification temperature. This, too, becomes a reliability and plugging issue, since the DIMM (for example) will not seat fully into the connector.

SUMMARY OF THE INVENTION

An object of this invention is to improve components that are secured to carrier substrates.

Another object of the invention is to provide an improved assembly of a component and a carrier substrate.

A further object of the preferred embodiment of the invention is to design expansion joints into SMT connectors to reduce the effect of CTE differential between the connectors and printed circuit boards.

These and other objectives are attained with an assembly of an electronic component and an electronic carrier substrate. The carrier substrate has a first coefficient of thermal expansion (CTE), and the electronic component has a second CTE. The assembly further comprises a conductive material on the carrier substrate for connecting the electronic component to the carrier substrate, and the electrical component is connected to the carrier substrate by heating and then cooling this conductive material. The electronic component includes an expansion joint to allow the electronic component to expand and contract relative to the carrier substrate during the heating and cooling of the conductive material.

With the preferred embodiment of the invention, one or more expansion joints are designed into an SMT connector housing. These joints allow the connector expansion to be controlled effectively shortening the relative connector length, minimizing the effect of thermal expansion differences between parts. Decreased stress in the solder joints will improve reliability and minimize connector bowing. This could also allow for a wider range of materials to be used for the connector housing, creating an opportunity for cost savings.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
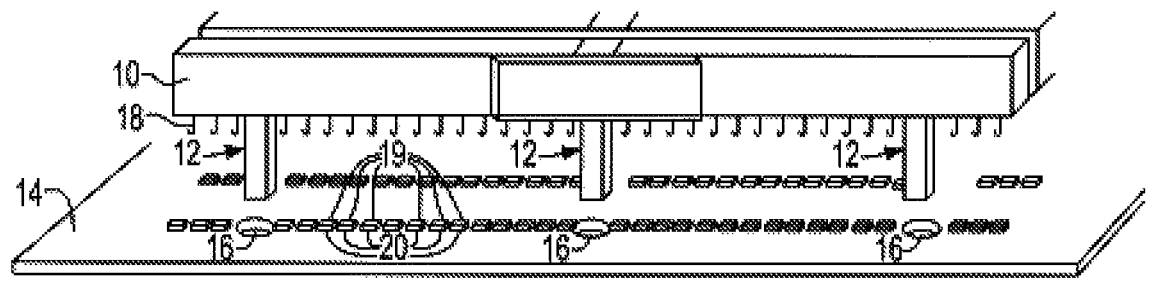
FIG. 1 is a partial, simplified view showing an SMT connector prior to placement on a carrier substrate.

In the following detailed description of the drawings, reference is made to the accompanying drawings, which are not necessarily to scale, which form a part hereof, and in which is shown by way of illustration specific embodiments of the invention that can be practiced. These embodiments are described in sufficient detail to enable those skilled in the art to practice them, and it is to be understood that features of the embodiments can be combined, or that other embodiments can be utilized and that procedural changes can be made without departing from the spirit and scope of the present invention. The following detailed description is, therefore, not to be taken in a limiting sense, and the scope of the invention is defined by the appended claims and their equivalents. In the drawings, like numerals describe substantially similar components throughout the several views.

Figure 2:
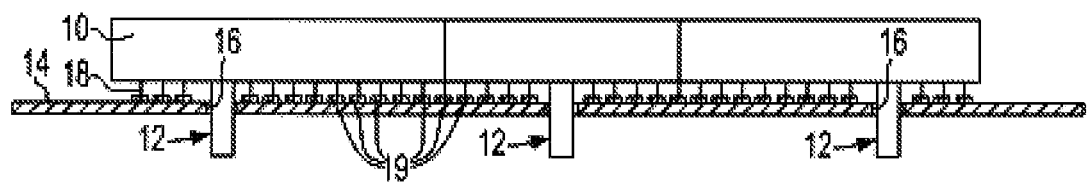
FIG. 2 is a partial, simplified side view of the SMT connector placed on the carrier substrate.
Figure 3:
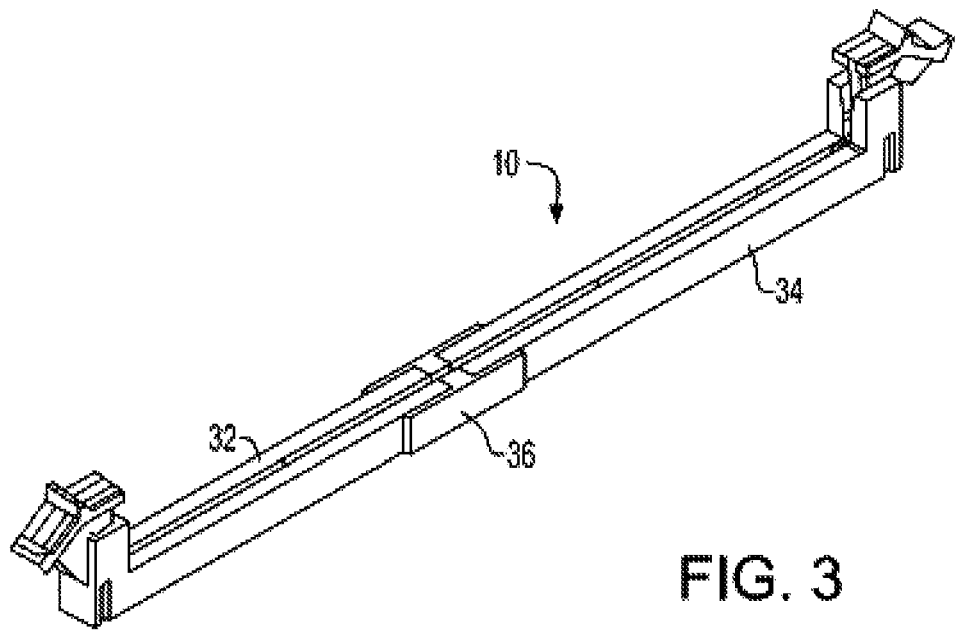
FIG. 3 is a more detailed view of the SMT connector.

FIGS. 1-3 illustrate a preferred embodiment of the present invention. Generally, SMT connector 10, having leads 18, is placed on a carrier substrate 14, such that leads 18 contact or are in close proximity to electrical interface pattern 20. Carrier substrate 14 can include printed circuit boards, interposers, motherboards, and the like. In the disclosed embodiment, the carrier substrate is a printed circuit board. The electrical connection between leads 18 and electrical interface pattern 20 is secured via conductive material 19. Conductive material 19 can include materials such as solder, both leaded and lead-free, conductive adhesives, and the like. In the reflow process, conductive material 19 is heated to a point at or above its melting temperature and then cooled. Retention pins 12, extending from connector 10, may be used to engage holes 16 in carrier substrate 14 when connector 10 is placed on carrier substrate 14.

A wide range of electronic components may be connected to carrier substrate 14 in accordance with the present invention. These components include, for example, dual inline memory module (DIMM) sockets, accelerated graphics port (AGP) sockets, peripheral component interconnected (PCI) sockets, and assorted other components.

Specifically, FIG. 1 depicts an SMT connector 10 prior to placement on carrier substrate 14. In the illustrated embodiment, a conductive material 19 is selectively applied to the electrical interface pattern 20 of carrier substrate 14 to bridge the connection and any gaps between the leads 18 and electrical interface pattern 20 when connector 10 is seated on the carrier substrate 14. When heated to its melting point, as in the reflow process, and subsequently cooled, conductive material 19 secures leads 18 to the electrical interface pattern 20. In the illustrated embodiment, a eutectic solder is used for conductive material 19, which is composed of 63% tin and 37% lead and has a reflow temperature of 183 degrees Celsius. A number of materials can be used for conductive material 19, including lead and lead-free solders, conductive adhesives and the like.

FIG. 2 depicts the SMT connector 10 placed on carrier substrate 14, with leads 18 connecting with electrical interface pattern 20 through conductive material 19, and with retention pins 12 extending through holes 16.

As mentioned above, with prior art connector and carrier substrate assemblies, varying coefficients of thermal expansion (CTE) between connectors and printed circuit boards create high stresses and unmanufacturable solder interfaces on long surface mount technology parts. This mismatch of CTEs will cause bowing of the connector, possibly lifting the connector contacts which in turn will result in missing or insufficient solder. Also, plugging problems may occur on the separable interface.

In order to prevent this bowing and to provide better contact between the connector leads and electrical pattern 20, one or more expansion joints are designed into connector housing. These joint allow the connector expansion to be controlled effectively shortening the relative connector length, minimizing the effect of thermal expansion differences between parts. Decreased stress in the solder joints will improve reliability and minimize connector bowing. This could also allow for a wider range of materials to be used for the connector housing, creating an opportunity for cost savings. The expansion joints are designed to hold true position of the connector solder tail leads while allowing the connector to expand during the reflow and cooling processes, minimizing the effects of CTE differential.

Connector 10 is comprised of first and second main sections 32 and 34 and joint section 36, which connects together the main sections 32 and 34 while allowing limited movement of those main sections relative to each other and, in assembly, relative to substrate 14. Sections 32 and 34 may be connected together in any suitable way. For example, one or more of the main sections 32 and 34 may be slidably connected to joint section 36 in a manner that allows one or more of the main sections to slide, along the longitudinal direction of connector 10, a limited amount towards and away from the other main section. Also, sections 32, 34 and 36 may be made of any suitable material such as a suitable plastic.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An assembly of an electronic component and an electronic carrier substrate comprising:
an electronic carrier substrate having a first coefficient of thermal expansion (CTE);

at least one electronic component having a second CTE; and a conductive material on the electronic carrier substrate for connecting said at least one electronic component to the electronic carrier substrate, wherein said at least one electronic component is connected to the electronic carrier substrate by heating and then cooling the conductive material; and wherein said at least one electronic component includes an expansion joint to allow said one electronic component to expand and contract relative to the carrier substrate during said heating and cooling of the conductive material; and said at least one electronic component includes first and second separate sections, and the expansion joint connects said first and second sections together and allows said first and second sections to slide along the substrate, and relative to each other and relative to the expansion joint, during said heating and cooling of the conductive material.

2. An assembly according to claim 1, wherein:
the carrier substrate has a substantially planar surface; and
said expansion joint enables said first and second sections to move relative to each other in a direction parallel to said planar surface when said at least one component is connected to the carrier substrate.

3. An assembly of an electronic component and an electronic carrier substrate comprising:
an electronic carrier substrate having a first coefficient of thermal expansion (CTE);
at least one electronic component having a second CTE; and
a conductive material on the electronic carrier substrate for connecting said at least one electronic component to the electronic carrier substrate, wherein said at least one electronic component is connected to the electronic carrier substrate by heating and then cooling the conductive material; and
wherein said at least one electronic component includes an expansion joint to allow said one electronic component to expand and contract relative to the carrier substrate during said heating and cooling of the conductive material; wherein
said at least one component includes first and second separate sections;
said expansion joint connects said first and second sections together and allows said first and second sections to move relative to each other during said heating and cooling of the conductive material; and
at least one of said separate sections is slidably connected to the expansion joint.

4. An assembly according to claim 1, wherein said first and second sections are slidably connected to the expansion joint.

5. An assembly according to claim 1, wherein:
said at least one component is a DIMM connector; and
said conductive material is a solder.

6. An assembly according to claim 5, wherein:
reflow and cooling processes are used to connect the DIMM connector to the carrier substrate by means of the solder; and
the expansion joint holds a true position of the connector solder tail leads while allowing the connector to expand during the reflow and cooling processes to reduce the effect of CTE differential.

7. An electronic component adapted to be connected to a carrier substrate and adapted to connect an electronic element to said carrier substrate, the electronic component comprising:
first and second separately moveable sections; and
an expansion joint connecting together said first and second sections and allowing said first and second sections to move relative to each other when the electronic component is connected to the carrier substrate; and
wherein the expansion joint connects said first and second sections together to allow said first and second section to slide along said carrier substrate, and relative to each other and relative to the expansion joint, during heating and cooling of the electronic component when the electronic component is connected to the carrier substrate.

8. An electronic component according to claim 7, wherein:
the electronic component is adapted to be connected to a planar surface of the carrier substrate; and
said expansion joint enables said first and second sections to move relative to each other in a direction parallel to said planar surface when the electronic component is connected to the carrier substrate.

9. An electronic component according to claim 8, wherein at least one of said first and second sections is slidably connected to the expansion joint.

10. An electronic component according to claim 8, wherein said first and second sections are slidably connected to the expansion joint.

11. An electronic component according to claim 7, wherein the electronic component is a DIMM connector.

* * * * *